United States Patent

(12) United States Patent
Wang et al.

(10) Patent No.: US 6,707,399 B1
(45) Date of Patent: Mar. 16, 2004

(54) DATA REALIGNMENT TECHNIQUES FOR SERIAL-TO-PARALLEL CONVERSION

(75) Inventors: Bonnie Wang, Cupertino, CA (US);
Chiakang Sung, Milpitas, CA (US);
Khai Nguyen, San Jose, CA (US);
Joseph Huang, San Jose, CA (US);
Gopi Rangan, Milpitas, CA (US); Nitin Prasad, Mipitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/269,370

(22) Filed: Oct. 10, 2002

(51) Int. Cl.[7] .................................................. H03M 9/00
(52) U.S. Cl. ...................................... 341/100; 712/204
(58) Field of Search ................................ 341/100, 101; 365/189.01, 230.03, 233, 236; 710/71; 375/369; 713/400; 712/204, 217

(56) References Cited

U.S. PATENT DOCUMENTS 4,447,804 A * 5/1984 Allen ........................... 341/100
4,517,683 A * 5/1985 Caspari ........................ 375/369
5,602,780 A * 2/1997 Diem et al. ............. 365/189.01
5,805,088 A * 9/1998 Butter et al. ................. 341/100
5,862,367 A * 1/1999 Chiao-Yen .................... 710/71
6,252,527 B1 * 6/2001 Yang ........................... 341/100

* cited by examiner

*Primary Examiner*—Patrick Wamsley
(74) *Attorney, Agent, or Firm*—Townsend and Townsend and Crew LLP; Steven J. Cahill

(57) ABSTRACT

Techniques for adjusting the boundary between bytes of data in a serial-to-parallel converter are provided. Bits of serial data are shifted into a first register. Data bytes are then shifted out of the first register along parallel signal lines into a second register. The timing of the parallel load of data from the first register to the second register determines the parallel data byte boundary. The boundary between the parallel data bytes can be shifted using a load enable signal. The phase of the load enable signal can be changed to shift the boundary between data bytes by one or more bits. The parallel data can then be loaded from the second register into a third register. The data output signal of the third register is synchronized to a core clock signal to ensure enough set up and hold time for signals output by the third register.

23 Claims, 3 Drawing Sheets

DATA REALIGNMENT TECHNIQUES FOR SERIAL-TO-PARALLEL CONVERSION

BACKGROUND OF THE INVENTION

The present invention relates to data realignment in serial-to-parallel converters, and more particularly, to techniques for realigning the boundary between data bytes when converting serial data to parallel data.

A serial-to-parallel converter circuit is used to convert a serial data stream into a parallel data stream. Bits of data are shifted into a shift register from a single input data stream. The data bits stored in the register are then simultaneously shifted out of the register along parallel signal lines as parallel data. Each data bit is output on a separate parallel signal line. The data bits are shifted out of the register as bytes of data (e.g., 8 bits each). Thus, the registers groups serial data bits into data bytes on parallel signal lines.

The register determines the boundary between one data byte and the next data byte. Typically, when serial data is converting to parallel data, the boundary between data bytes is determined randomly, depending upon when the data transmitting and receiving devices power up.

Therefore, it would be desirable to provide techniques to realign the boundary between output data bytes from a serial-to-parallel data converter to match a preset data boundary.

BRIEF SUMMARY OF THE INVENTION

The present invention includes techniques for adjusting the boundary between bytes of data in a serial-to-parallel converter. Bits of serial data are shifted into a first register. A first clock signal controls the shifting of data into the first register. Data bytes are then shifted out of the first register along parallel signal lines into a second register. The timing of the parallel load of data from the first register to the second register determines the parallel data byte boundary.

A load enable signal controls the loading of parallel data into the second register. The boundary between the parallel data bytes can be realigned using the load enable signal. The phase of the load enable signal can be changed to shift the boundary between data bytes by one or more bits.

The parallel data is then loaded from the second register into a third register. A second load signal controls the loading of data into the third register. The phase of the second load signal is fixed relative to a second clock signal. The second clock signal controls the circuitry that receives the parallel data output of the third register. The parallel data output of the third register is synchronized to the second clock signal to ensure enough set up and hold time for the data signals output by the third register.

DETAILED DESCRIPTION OF THE INVENTION

Figure 1:
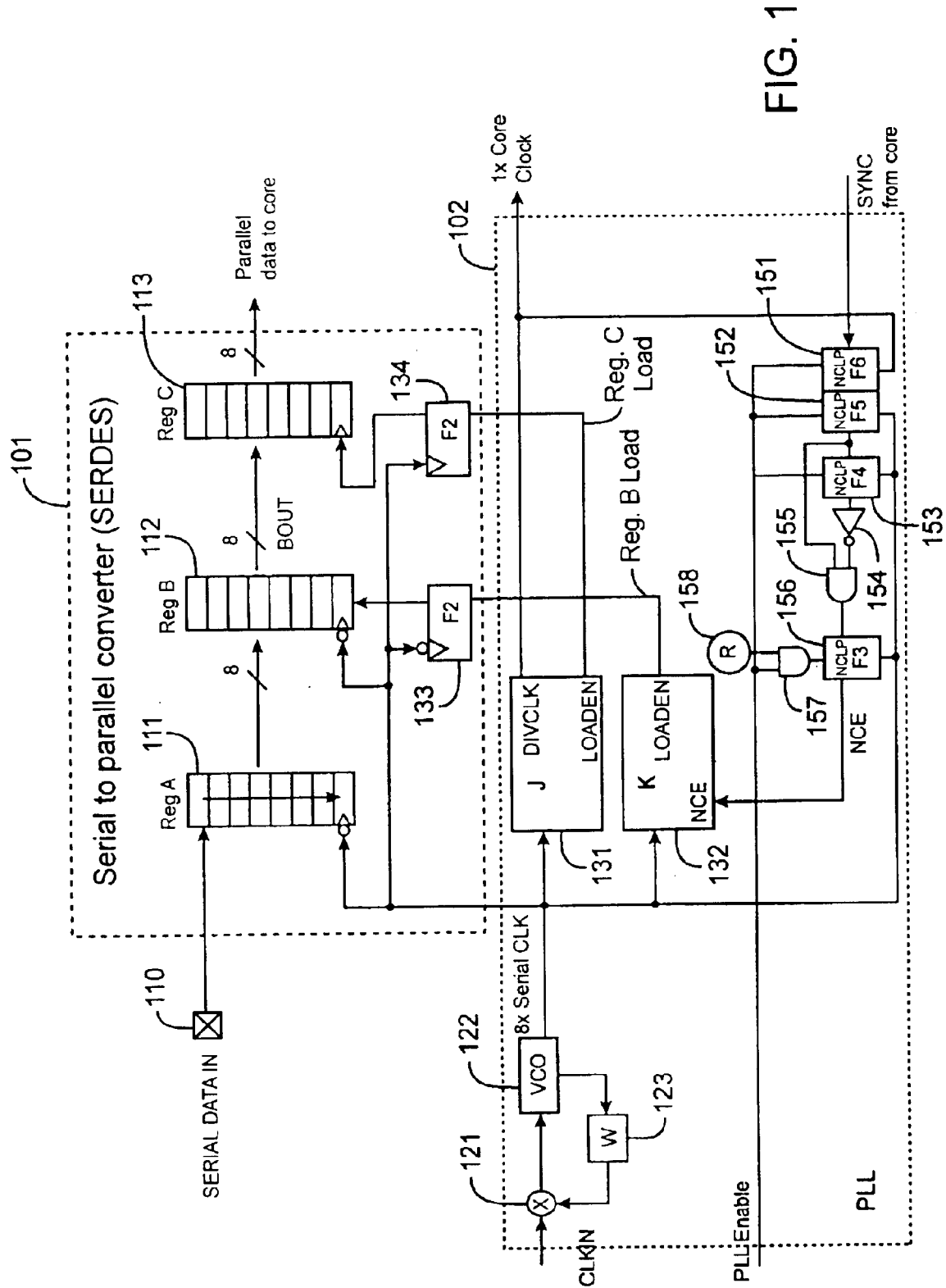
FIG. 1 is a diagram of a serial-to-parallel converter that uses the data realignment techniques of the present invention.

FIG. 1 illustrates an embodiment of the present invention. Serial-to-parallel converter 101 is coupled to a phase locked loop block (PLL) 102 as shown in FIG. 1.

Serial-to-parallel data converter 101 converts serial input data received at input/output (I/O) pin 110 to parallel output data. Converter 101 includes registers 111–113 (also referred to as registers A, B, and C in FIG. 1). The serial data is initially shifted into register 111 bit by bit. For example, eight bits may be loaded into register 111. The number eight is chosen for illustration purposes only and is not intended to limit the present invention. Register 111 may store any suitable number of bits.

After a predetermined number of bits have been shifted into register 111, these bits are shifted out of register 111 along parallel signal lines. For example, 8 bits stored in register 111 can be output along 8 parallel signal lines to form an 8-bit byte.

A byte of data from register 111 is then loaded into register 112. Register 112 can shift the boundary between parallel data bytes by one or more bits.

Data bytes are then loaded from register 112 into register 113. The data is subsequently transferred out of register 113 into circuitry outside of converter 101. For example, the data can be transferred to core circuitry in a programmable logic device, a field programmable gate array, or a programmable logic array.

PLL block 102 generates signals that control the operation of serial-to-parallel converter 101. PLL block 102 accepts a clock signal (CLK IN) as an input signal. The input clock signal is provided to a phase locked loop circuit that includes phase detector 121, voltage controlled oscillator 122, and feedback divide down circuit 123. Circuit 123 allows the PLL to generate a frequency that is greater than its input frequency. Phase detector 121 also includes a charge pump circuit. The phase locked loop circuitry operates according to well-known phase locked loop techniques.

The period of the input clock signal corresponds to the length of one byte of data in the input serial data stream at pin 110. Voltage controlled oscillator 122 outputs a clock signal Serial CLK. The Serial CLK clock signal controls the shifting of data bits through register 111.

The frequency of Serial CLK is a variable X times faster than the frequency of the input clock signal CLK IN. In one embodiment of the present invention, X is the number of bits in each byte of data. For example, if register 111 simultaneously outputs 8 bits in each byte of parallel data, the frequency of the Serial CLK signal is 8 times faster than the frequency of the input clock signal CLK IN. In this example, each serial data bit corresponds to one period of Serial CLK, and 8 serial data bits correspond to one period of CLK IN.

In another embodiment of the present invention, the number of bits in the parallel output of register 111 can be different than X. For example, if the frequency of the Serial CLK signal is 4 times faster than the frequency of CLK IN, register 111 can simultaneously output 8 bits in each byte of parallel data.

Figure 2:
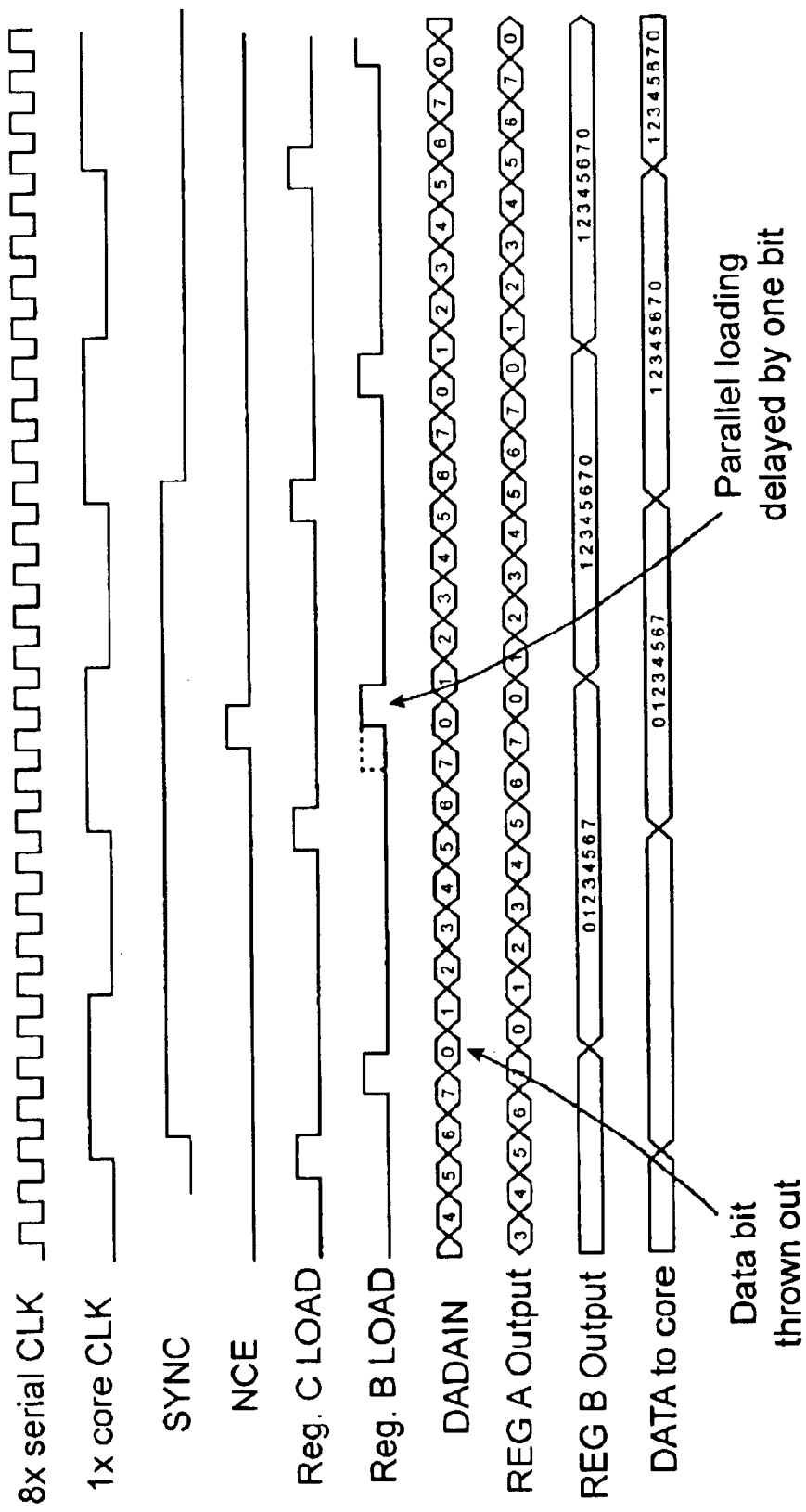
FIG. 2 is a graph that shows signals of the serial-to-parallel converter of FIG. 1.

FIG. 2 illustrates an example of the Serial CLK signal. In each period of Serial CLK, a new serial input bit is stored in the first memory cell of register 111, and each bit already stored in register 111 is shifted one memory cell down in the direction of the arrow shown in FIG. 1. When one byte of data comprising N bits (e.g., 8 bits) has been stored in register 111, the data byte is loaded into register 112 along N parallel signal lines.

The Serial CLK signal is provided to inputs of two counters 131 and 132. Counters 131 and 132 output periodic signals Register C Load and Register B Load, respectively. Counters 131 and 132 divide the frequency of the Serial CLK signal by the same ratio as the serial-to-parallel conversion ratio. For example, if register 111 converts sets of 8 serial bits into 8-bit parallel bytes, then the frequencies of the Register C Load and Register B Load signals are one-eighth the frequency of the Serial CLK signal.

Counter 131 also generates a Core Clock signal. The frequency of the Core Clock signal corresponds to one byte of data. For example, if 8 bits are in one byte, then one period of the Core Clock equals eight periods of the Serial CLK signal. The Core Clock signal is used to control circuitry that receives the parallel output data of serial-to-parallel converter 101.

Register 133 is coupled to counter 132 and register 112. Register 133 provides the Register B Load signal to register 112. Register 133 synchronizes the Register B Load signal to the Serial CLK clock signal. Register 133 also eliminates the skew between the Register B Load signal and the Serial CLK signal due to delays from PLL 102 and serial-to-parallel converter 101.

Register 134 is coupled to counter 131 and register 113. Register 134 provides the Register C Load signal to register 113. Register 134 synchronizes the Register C Load signal to the Serial CLK clock signal. Register 134 also eliminates the skew between the Register C Load signal and the Serial CLK signal due to delays from PLL 102 and serial-to-parallel converter 101.

Examples of the Register C Load and Register B Load signals are shown in FIG. 2. The period of the Register B Load signal determines the length of a data byte. When the Register B Load signal is HIGH, register 133 outputs a signal that causes the data bits stored in register 111 to be loaded into corresponding memory cells in register 112 on the falling edge of Serial CLK.

In the example shown in FIG. 2, eight bits are transferred from register 111 to register 112 in each cycle of the Register B Load signal. A data byte is transferred from register 111 to register 112 during one cycle of the Serial CLK signal.

When the Register C Load signal is HIGH, register 134 outputs a signal that causes one data byte to be transferred from register 112 into register 113 at the next rising edge of the Serial CLK signal. Because register 112 changes state at the falling edge of the Serial CLK signal, the data bits have at least one-half of a period of Serial CLK to travel from register 112 to register 113. The circuitry should be fast enough to transfer the data in this time period.

Register 113 synchronizes the data with the Core Clock signal. The Core Clock signal is used to control the core circuitry (e.g., core circuitry in a programmable logic device). Register 113 synchronizes its output data with the Core Clock signal in order to provide enough set up and hold time before the data signals are loaded into the core circuitry.

The phase of the Register C Load signal is fixed relative to the Core Clock signal. In the example shown in FIG. 2, the rising edge of Register C Load signal always occurs just before the Core Clock signal.

The Core Clock signal controls when data bytes are transferred from register 113 to the core circuitry outside converter 101. A byte of data is transferred from register 113 to the core circuitry on the rising edge of the Core Clock signal. For example, the data may be transferred to core circuitry within a programmable logic device (PLD), a field programmable gate array (FPGA), or a programmable logic array (PLA).

The Register B Load signal determines the boundary between one data byte and the next data byte in converter 101. The boundary between data bytes is initially determined randomly depending upon when the data transmitting and data receiving devices power up.

Circuitry in PLL block 102 can be used to realign the boundary between data bytes in register 112 so that the data bits are separated into bytes at the correct boundary point. This circuitry includes registers 151, 152, 153, and 156 and logic gates 154, 155, and 157.

If serial-to-parallel converter 101 is not separating data bits into bytes at the correct boundary point, the SYNC signal is pulsed HIGH. The SYNC signal can be driven by a user built state machine on the same integrated circuit as converter 101 or from an input/output pin. The state machine can determine the correctness of the data byte boundaries by passing a sample serial data stream through converter 101 and comparing the output of converter 101 with a predetermined set of parallel data.

Each time that the SYNC signal goes HIGH, the boundary between each byte shifts forward one bit. When the byte boundary shifts forward, one bit of sample data is thrown out as shown in FIG. 2.

The SYNC signal is received by register 151. Register 151 synchronizes the SYNC signal to the Core Clock signal. Registers 151, 152, 153, and 156 are turned ON and OFF by the PLL enable signal.

The output signal of register 152 and the inverted output signal of register 153 are input signals to AND gate 155. An input of register 156 receives the output signal of AND gate 155.

Registers 152–153 and 156 are coupled to receive the Serial CLK clock signal. The output signal of register 156 is signal NCE. Registers 152–153 and 156 synchronize the NCE signal with the Serial CLK clock signal.

A time period after the SYNC signal is HIGH, the output signal NCE of register 156 goes HIGH. The function of registers 151–153 and 156 is to detect the rising edge of SYNC and to generate the NCE pulse. FIG. 2 illustrates example waveforms for signals SYNC and NCE. NCE should be short enough to cause the byte boundary to shift by one bit.

When the NCE signal goes HIGH, counter 132 delays the next rising edge of the Register B Load signal by one period of the Serial CLK clock signal. As discussed above, the Register B Load signal determines the boundary between data bytes. By delaying the next rising edge of the Register B Load signal, the boundary between data bytes moves forward by one bit.

Thus, when the NCE signal goes HIGH, the period of the Register B Load signal temporarily increases, and its frequency temporarily decreases. Put another way, the phase of the Register B Load signal changes in response to the NCE signal.

The data boundary change is illustrated by the Register B output signal in FIG. 2. Before the NCE signal goes HIGH, the boundary between data bytes occurs between bit 7 and bit 0. One byte of data during this time corresponds to the sequence 01234567.

After the NCE signal goes HIGH, the data byte boundary moves forward by one bit. The data byte boundary now occurs between bit 0 and bit 1. The 0 bit is thrown out, because it is not included in the previous byte or in the next byte. Subsequent bytes of data correspond to the sequence 12345670.

The Serial CLK clock signal causes input data bits to be continuously shifted into register 111. When NCE is HIGH, the data bit in the last memory cell of register 111 is lost, while the next data bit is shifted in. The bits stored in register 111 are then loaded into register 112 when the Register B Load signal is HIGH. This process causes the boundary between the next parallel data byte to be shifted one bit forward with respect to the previous data byte.

The SYNC signal can be pulsed HIGH again to move the boundary between data bytes forward by another bit. When the NCE signal goes HIGH a second time, the boundary between data bytes moves between bit 1 and bit 2, and the next bit 1 is thrown out. The data sequence for subsequent bytes corresponds to bits 23456701. The SYNC signal can be pulsed any number (M) times to move the boundary between bytes forward by M bits. In other embodiments, the SYNC signal can be pulsed to any voltage level (e.g., LOW) to move the boundary between data bytes.

The data byte realignment feature of FIG. 1 can be disabled by RAM bit 158. If RAM bit 158 is programmed to be LOW, NCE is held LOW. When NCE is held LOW, no data byte boundary shifting can happen regardless of the state of the SYNC signal.

Figure 3:
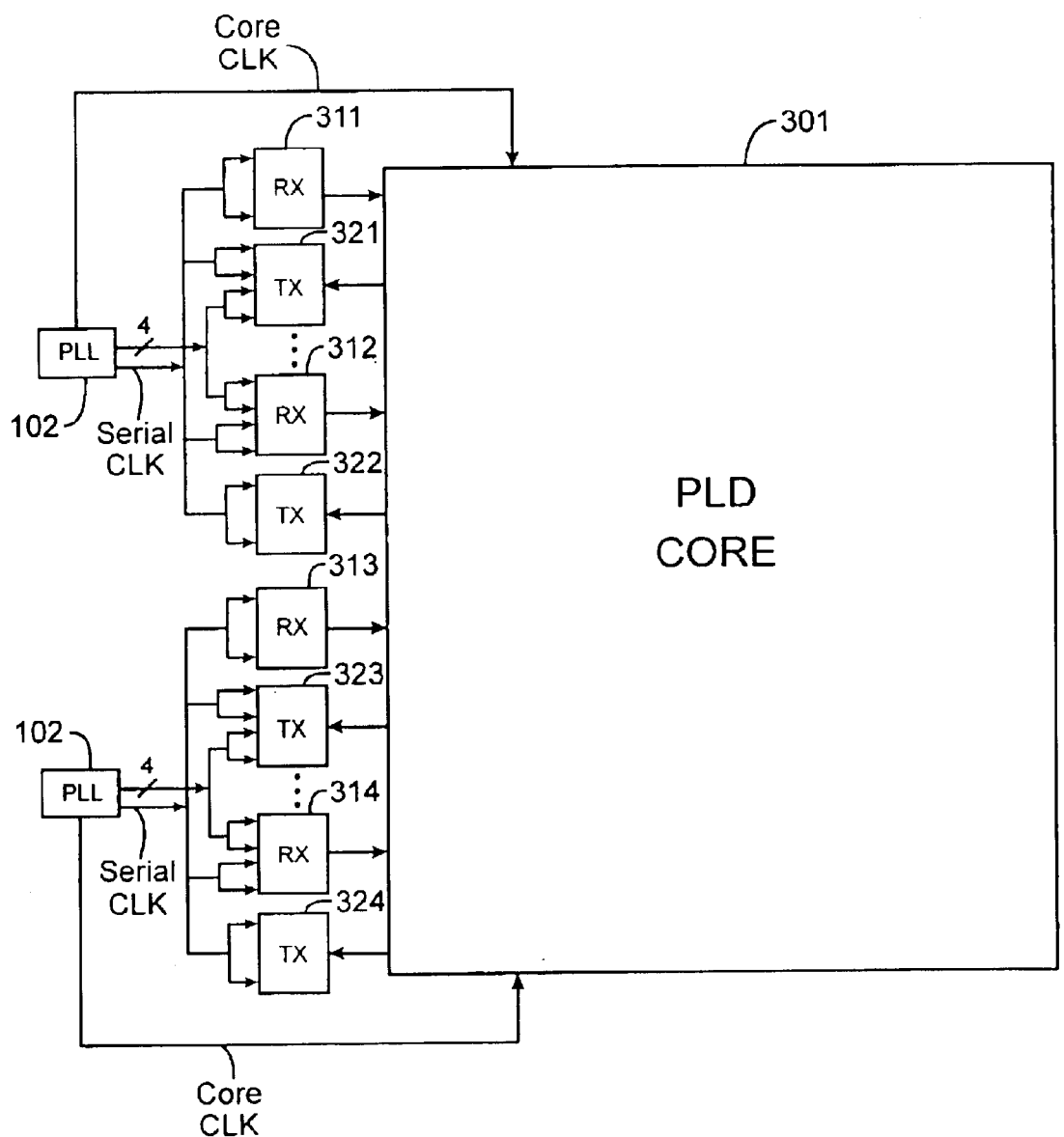
FIG. 3 is a diagram that shows phase locked loops, transmitters, and receivers embedded in a programmable logic device in accordance with the present invention.

Phase locked loops and serial-to-parallel converters of the present invention can be embedded on a PLD, FPGA, or PLA integrated circuit. FIG. 3 illustrates an example of an integrated circuit that includes serial-to-parallel data converters and phase locked loops embedded in a programmable logic device (PLD) in accordance with the present invention.

Phase locked loops (PLLs) 102 generate the Core Clock and Serial Clock signals as discussed above with respect to FIG. 1. Each PLL 102 provides a Core Clock (CLK) signal to the PLD core circuitry 301. The PLD core 301 may include logic elements, interconnect conductors, memory, etc.

Each PLL 102 also generates a Serial clock (CLK) signal. A user can select a slow Serial CLK signal or one of 4 faster Serial CLK signals that are shown in FIG. 3. The Serial CLK signals are provided to receivers 311–314 and transmitters 321–324. The 4 faster Serial CLK signals are only provided to a subset of the receivers and a subset of the transmitters as shown in FIG. 3.

Each of the receivers 311–314 includes a serial-to-parallel data converter of the present invention such as converter 101 in FIG. 1. Receivers 311–314 receive serial input data, convert the serial data to parallel data, and drive the parallel data into core circuitry 301.

Each of the transmitters 321–324 includes a parallel-to-serial data converter. Transmitters 321–324 receives parallel data from core circuitry 301, convert the parallel data into serial data, and drive the serial data out of the PLD. For example, the transmitters can drive the serial data to input/output (I/O) pins on the PLD.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for converting serial data to parallel data, the method comprising:

serially loading bits of data into a first register in response to a first periodic signal;

parallel loading bytes of the data from the first register into a second register in response to a second periodic signal; and changing each of the boundaries between the data bytes in response to a third signal.

2. The method of claim 1 wherein changing the boundaries between the data bytes in response to the third signal further comprises realizing a data boundary between bytes of the data bytes by one bit in response to the second periodic signal.

3. The method of claim 2 wherein changing the boundaries between the data bytes in response to the third signal further comprises realigning a data boundary between bytes of the data bytes by two bits in response to the second periodic signal.

4. The method of claim 1 wherein changing the boundaries between the data bytes in response to the third signal further comprises changing the phase of the second periodic signal in response to the third signal, wherein the change in the phase of the second periodic signal causes one of the bits of the data stored in the first register to be discarded.

5. The method of claim 1 further comprising:

disabling the third signal to prevent the boundaries between the data bytes from changing.

6. A method for converting serial data to parallel data, the method comprising:

serially loading bits of data into a first register in response to a first periodic signal;

parallel loading bytes of the data from the first register into a second register in response to a second periodic signal;

changing boundaries between the data bytes in response to a third signal; and parallel loading the data bytes from the second register into a third register.

7. The method of claim 6 further comprising:

generating fourth and fifth periodic signals, wherein the third register synchronizes the data bytes to the fourth periodic signal in response to the fifth periodic signal, and wherein the fourth periodic signal is used as a clock signal by core circuitry that receives the data from the third register.

8. The method of claim 6 further comprising:

parallel loading the data bytes from the third register into core circuitry of a programmable logic device.

9. A method for converting serial data to parallel data, the method comprising:

serially loading bits of data into a first register in response to a first periodic signal;

parallel loading bytes of the data from the first register into a second register in response to a second periodic signal;

changing boundaries between the data bytes in response to a third signal;

generating the first periodic signal using a phase lock loop; and providing the fist periodic signal to an input of a first counter, wherein the first counter generates the second periodic signal.

10. The method of claim 9 further comprising:

parallel loading the data bytes from the second register into a third register; and providing the first clock signal to an input of a second counter, wherein the second counter generates a fourth periodic signal that controls when the data bytes are loaded into the third register.

11. A serial-to-parallel data conversion circuit comprising:

a first register coupled to receive serial data;

a second register coupled to receive parallel data bytes from the first register; and a first counter circuit providing a first periodic signal that controls when the parallel data bytes are transferred from the first register to the second register, the first periodic signal causing boundaries between the parallel data bytes to change in response to a second signal.

12. The serial-to-parallel data conversion circuit of claim 11 further comprising:

a third register coupled to receive the parallel data bytes from the second register; and a second counter circuit providing a third periodic signal that controls when the parallel data bytes are transferred from the second register into the third register.

13. The serial-to-parallel data conversion circuit of claim 12 wherein the third register synchronizes the parallel data to a fourth periodic signal generated by the second counter.

14. The serial-to-parallel data conversion circuit of claim 12 further comprising:

a fourth register coupled between the first counter and the second register; and a fifth register coupled between the second counter and the third register.

15. The serial-to-parallel data conversion circuit of claim 11 further comprising:

a phase locked loop circuit that provides a third periodic signal to the first and second registers and to the first counter, wherein data is shifted through the first and second registers in response to the third periodic signal.

16. The serial-to-parallel data conversion circuit of claim 11 further comprising:

a third register coupled to the first counter, the third register generating the second signal, wherein an input of the third register is coupled to receive a fourth signal that blocks the second signal.

17. A method for converting serial data to parallel data, the method comprising:

loading bits of the serial data into a first data storage circuit in response to a first periodic signal;

loading the bits from the first data storage circuit into a second data storage circuit as parallel data bytes in response to a second periodic signal, wherein boundaries between the parallel data bytes are determined by the second periodic signal; and shifting the boundaries between each of the parallel data bytes in response to a third signal.

18. The method of claim 17 wherein shifting the boundaries between the parallel data bytes in response to the third signal further comprises increasing the period of the second periodic signal in response to the third signal.

19. The method of claim 17 further comprising:

disabling the third signal to prevent the boundary between parallel data bytes from shifting.

20. A method for converting serial data to parallel data, the method comprising:

loading bits of the serial data into a first data storage circuit in response to a first periodic signal;

loading the bits from the first data storage circuit into a second data storage circuit as parallel data bytes in response to a second periodic signal, wherein boundaries between the parallel data bates are determined by the second periodic signal;

shifting the boundaries between the parallel data bytes in response to a third signal;

loading the parallel data bytes from the second data storage circuit into a third data storage circuit; and generating a fourth periodic signal that controls when the data bytes are loaded into the third data storage circuit.

21. A method for converting serial data to parallel data, the method comprising:

loading bits of the serial data into a first data storage circuit in response to a first periodic signal;

loading the bits from the first data storage circuit into a second data storage circuit as parallel data bytes in response to a second periodic signal, wherein boundaries between the parallel data bytes are determined by the second periodic signal;

shifting the boundaries between the parallel data bytes in response to a third signal;

generating the first periodic signal using a phase lock loop; and providing the first periodic signal to an input of a first counter, wherein the first counter generates the second periodic signal.

22. A serial-to-parallel data converter comprising:

means for storing bits of serial data in a first storage circuit;

means for storing the bits as parallel data bytes in a second storage circuit;

means for providing a first periodic signal that controls when the bits are transferred from the first storage circuit to the second storage circuit;

means for providing a second signal to the means for providing the first periodic signal, wherein the first periodic signal causes a boundary between the parallel data bytes to change in response to the second signal; and means for generating a third periodic signal using a phase locked loop, wherein the third periodic signal is provided to the first and the second storage circuits and to the means for providing the first periodic signal.

23. The serial-to-parallel converter of claim 22 further comprising:

means for storing the parallel data bytes in a third storage circuit; and means for providing a third periodic signal that controls when the parallel data bytes are transferred from the second storage circuit to the third storage circuit.

* * * * *